(12) United States Patent
Himori et al.

(10) Patent No.: US 7,510,759 B2
(45) Date of Patent: Mar. 31, 2009

(54) ELECTRONIC PART AND MANUFACTURING METHOD THEREOF

(75) Inventors: Tsuyoshi Himori, Osaka (JP); Shogo Hirai, Osaka (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 10/541,321

(22) PCT Filed: Nov. 29, 2004

(86) PCT No.: PCT/JP2004/017678

§ 371 (c)(1), (2), (4) Date: Jun. 30, 2005

(87) PCT Pub. No.: WO2005/055683

PCT Pub. Date: Jun. 16, 2005

(65) Prior Publication Data

US 2006/0118905 A1    Jun. 8, 2006

(30) Foreign Application Priority Data

Dec. 2, 2003   (JP) ............................ 2003-402606

(51) Int. Cl.
*B32B 9/00* (2006.01)
*H05K 1/00* (2006.01)

(52) U.S. Cl. ............... 428/209; 428/210; 361/751; 174/255; 174/258; 427/126.3; 427/126.6; 427/372.2

(58) Field of Classification Search ......... 428/209–210, 428/901; 361/751; 174/255, 258; 427/126.3, 427/126.6, 372.2
See application file for complete search history.

(56) References Cited

U.S. PATENT DOCUMENTS

| | | | | |
|---|---|---|---|---|
| 4,609,611 A | * | 9/1986 | Sigyo et al. | 430/270.12 |
| 4,795,670 A | * | 1/1989 | Nishigaki et al. | 428/209 |
| 5,665,459 A | * | 9/1997 | Fukuta et al. | 428/209 |
| 5,924,623 A | * | 7/1999 | Kenney | 228/180.22 |
| 6,586,683 B2 | * | 7/2003 | Arrington et al. | 174/255 |
| 6,717,266 B1 | * | 4/2004 | Marathe et al. | 257/751 |
| 6,756,306 B2 | * | 6/2004 | Avanzino et al. | 438/687 |

FOREIGN PATENT DOCUMENTS

| | | |
|---|---|---|
| JP | 54-086766 | 7/1979 |
| JP | 08-181423 | 7/1996 |
| JP | 2000-031625 | 1/2000 |
| JP | 2000-174423 | 6/2000 |

* cited by examiner

*Primary Examiner*—Cathy Lam
(74) *Attorney, Agent, or Firm*—McDermott Will & Emery LLP

(57) ABSTRACT

An electronic component includes conductive pattern (2) on insulating substrate (1), a metal film formed by a plating method on a surface of conductive pattern (2), and metal oxide layer (3) formed by oxidizing the metal film on the surface of conductive pattern (2). This structure allows forming a thin and uniform insulating film on conductive pattern (2), so that the highly reliable electric component is obtainable although its conductive pattern (2) has a high aspect ratio.

13 Claims, 5 Drawing Sheets

ELECTRONIC PART AND MANUFACTURING METHOD THEREOF

This application is a U.S. National Phase Application of PCT International Application PCT/JP2004/017678.

TECHNICAL FIELD

The present invention relates to electronic components to be used in a variety of electronic devices and communication devices, and a method of manufacturing the same electronic components.

BACKGROUND ART

Electronic components of this kind have been demanded to be downsized, to be thinner and to be more sophisticated. On top of that, the market trend of higher speed signaling and digitized devices has required a conductive pattern of the components to be finer and more accurate. Development of finer conductive patterns and thicker films for preventing a wiring resistance from increasing has been advancing in order to meet those requirements, i.e. downsizing, more accuracy, and finer patterns. As a result, the need for forming conductive patterns of higher aspect ratio intensifies.

An electronic component including a conventional conductive pattern is described hereinafter with reference to FIG. 9, which shows a sectional view of the pattern. In FIG. 9, conductive pattern 22 is formed on substrate 21 by printing. Use of electrode material, such as Ag being excellent in conductivity but subject to migration, for pattern 22 usually needs an insulating protective film to cover pattern 22 because of maintaining reliability.

For instance, use of a ceramic-based substrate, e.g. aluminum oxide, as substrate 21 employs insulating protective film 23 made of glass. This film is formed by printing glass-paste, i.e. a mixture of glass powder as a major component, binder and solvent, at a given thickness, then the paste is dried and baked to be the film. Use of compound organic material such as glass-epoxy as substrate 21 employs insulating protective film 23 made of organic material because it is difficult for this substrate 21 to undergo a heat treatment at an excessively high temperature. In this case, film 23 is formed by screen-printing resin paste made mainly of organic material, then the resin undergoes a heat curing process to be film 23. In addition to the foregoing methods, the sputtering method one of thin-film methods can be used for forming $SiO_2$ film as insulating protective film 23.

Electronic components having conductive patterns are disclosed in Japanese Patent Unexamined Publication No. H11-2887799 and ditto H09-237976.

Fine conductive patterns made from electrode material such as Ag is formed on substrate 21 made of the foregoing materials, then insulating protective film 23 is formed by a printing method such as screen-printing. Film 23 thus formed tends to be short of uniformity of film thickness, or tends to produce air bubbles 24 and air gaps 25. As a result, conductive pattern 22 decreases its reliability. Although the foregoing printing method is good at productivity, it is poor at forming film 23 uniform in thickness with accuracy because of viscoelasticity characteristics of the paste.

At the edges of conductive patterns 22, in particular, film 23 becomes thinner or tends to trap air-bubbles 24 in patterns 22. A narrow space between patterns 22 tends to produce air-gaps 25 because the spaces cannot be fully filled with paste.

The thin-film method can form a film uniformly in thickness on a plane section of pattern 22 (parallel with the surface of substrate 21), so that no problem is found. However, it is difficult for the thin-film method to form a film uniformly in thickness on pattern's wall face (vertical with respect to the surface of substrate 21).

In other words, if insulating protective film 23 is formed by the conventional method, it is difficult to prevent the electrode made of Ag from migrating into others. A higher aspect ratio (a ratio of height vs. width) of pattern 22 increases probability of incurring various defects of film 23. As a result, it is difficult to maintain the reliability of withstanding migration. The present invention aims to solve the problems discussed above, and provide highly reliable electronic components having conductive patterns with a high aspect ratio.

DISCLOSURE OF THE INVENTION

The present invention provides an electronic component comprising the following elements:
  a conductive pattern formed on an insulating substrate;
  metal film formed on a surface of the conductive pattern by plating; and
  a metal oxide layer made by oxidizing the metal film, and formed on the surface of the conductive pattern.

The present invention provides a method of manufacturing the electronic component, the method comprising the steps of:
  forming a conductive pattern on an insulating substrate;
  forming a nickel film by a plating method at least on a surface of the conductive pattern; and
  forming a metal oxide layer of nickel oxide at least on the surface of the conductive pattern by providing the nickel film with an oxidizing heat treatment at a temperature between 850° C. and the melting point of the electrode material forming the conductive pattern.

Figure 1:
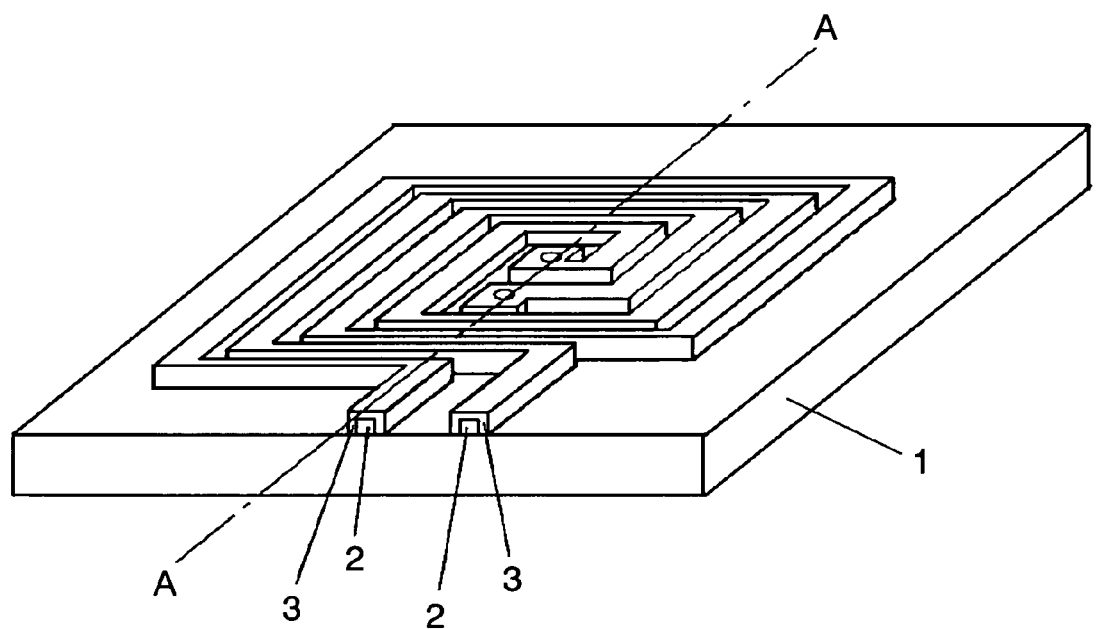
FIG. 1 shows a perspective view of a common-mode choke coil as an electronic component in accordance with a first exemplary embodiment of the present invention.
Figure 2:
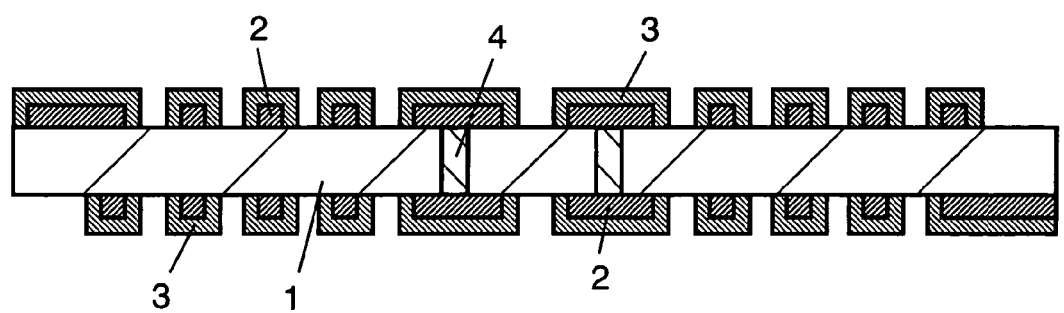
FIG. 2 shows a sectional view of the common-mode choke coil in accordance with the first embodiment shown in FIG. 1 taken along line A-A'.

DESCRIPTION OF REFERENCE MARKS 1, 21 substrate
2, 22 conductive pattern
3 metal oxide layer
4 through-hole
5 metal film
6 protective film
7 end-face electrode
8 resistor pattern
9 component
10 end-face electrode section
23 insulating protective film
24 air bubble
25 air gap

DETAILED DESCRIPTION OF PREFERRED EMBODIMENTS

The present invention provides an electronic component comprising the following elements:
conductive patterns formed on an insulating substrate;
a metal film formed on a surface of the conductive pattern by a plating method; and
a metal oxide layer made by oxidizing the metal film, and formed on the surface of the conductive pattern.

According to the foregoing structure, an insulating thin film of uniform thickness is formed on the conductive patterns, so that a reliable electronic component is obtainable even its conductive patterns have a high aspect ratio.

The electronic component of the present invention comprises the following elements:
conductive patterns on an insulating substrate;
a metal film formed on a surface of the conductive pattern and spaces between the conductive patterns on the substrate by a plating method; and
a metal oxide layer, made by oxidizing the metal film, formed on the surface of the conductive pattern and spaces between the conductive patterns on the substrate.

According to the foregoing structure, an insulating thin film of uniform thickness is formed on the conductive patterns and the spaces between the conductive patterns on the substrate. As a result, a more reliable electronic component is obtainable although its conductive patterns have a high aspect ratio.

The electronic component of the present invention comprises the following elements:
conductive patterns formed on an insulating substrate;
a metal film formed on a surface of the substrate where the conductive patterns are formed; and
a metal oxide layer, made by oxidizing the metal film, formed on the surface of the substrate.

According to this structure, an insulating thin film of a uniform thickness is formed on the entire conductive patterns as well as on the entire substrate, so that an electronic component having more reliable and fine conductive patterns is obtainable.

Use of a ceramic substrate having a high heat resistance and being excellent in heat conductivity allows the present invention to achieve electronic components having conductive patterns fine enough for power-source modules, which outputs a high power and needs high heat resistance as well as high heat dissipation.

Use of a glass-ceramic substrate easy to be multi-layered and excellent in productivity allows the present invention to achieve compact electronic components in a laminated structure having fine conductive patterns.

Use of an organic substrate allows the present invention to achieve electronic components excellent in productivity, flexibility, and shock resistance and having fine conductive patterns.

Use of electrode material, which contains at least Ag, in the conductive patterns allows the present invention to achieve reliable electronic components having fine conductive patterns which have less loss because of low wiring resistance.

Selection of electrode material from the group consisting of Ag, Ag—Pt, and Ag—Pd allows the present invention to achieve electronic components of stronger anti-migration property.

An electronic component of the present invention includes a metal oxide layer containing one of NiO, ZnO, and CuO. This structure can be achieved with ease by oxidizing a metal film formed by a plating method, so that electronic components having fine conductive patterns excellent in productivity can be obtained.

The present invention allows obtaining a metal oxide layer having a film uniform thickness ranging from 0.5-5 μm, so that electronic components having fine conductive patterns excellent in reliability are obtainable.

A part of the conductive patterns is exposed from the surface of the component, so that the present invention can achieve an electronic component mountable to semiconductors or other components by soldering.

A part of the conductive patterns and a part of the substrate are exposed, so that the present invention can achieve an electronic component, on which other conductive patterns or other components can be formed.

The present invention provides a method of manufacturing electronic components, and the method comprises the steps of:
forming conductive patterns on an insulating substrate;
forming a metal film by a plating method on a surface of the conductive patterns on the substrate; and
forming a metal oxide layer on the surface of the conductive pattern by oxidizing the metal film.

This method allows forming a metal oxide layer of high uniformity even the conductive patterns have a high aspect ratio and the surface of the pattern has rough peaks and valleys.

The present invention provides another method of manufacturing electronic components, and the method comprises the steps of:
forming conductive patterns on an insulating substrate;
forming a metal film on a surface of the conductive pattern and on spaces between electrodes of the conductive patterns on the substrate by a plating method; and
forming a metal oxide layer, made by oxidizing the metal film, on the surface of the conductive pattern and spaces between the electrodes of the conductive patterns on the substrate.

According to the foregoing method, a metal oxide layer of high uniformity can be formed between the conductive patterns having narrow spaces between the electrodes on the substrate.

The present invention provides a method of manufacturing electronic components, and the method comprises the steps of:
- forming conductive patterns on an insulating substrate;
- forming a metal film by a plating method on a surface of the conductive patterns on the substrate; and
- forming a metal oxide layer, made by oxidizing the metal film, on the surface of the substrate.

According to the foregoing method, a thin metal oxide layer can be formed uniformly on the entire face of the substrate.

The present invention provides a method of manufacturing electronic components, and the method uses electroless plating as the plating method, so that a thin and uniform metal oxide layer can be formed on electronic components having complicated conductive patterns.

The present invention provides a method of manufacturing electronic components, and the method uses a heat treatment as the oxidizing process, which is thus carried out with ease because the heat treatment is very simple.

The manufacturing method of the present invention carries out the heat treatment at a temperature not higher than a melting point of the conductive patterns, so that the electronic components by this method have less deterioration in the patterns and fewer changes in wiring resistance.

The present invention provides a method of manufacturing electronic components, and the method comprises the steps of:
- forming a conductive pattern on an insulating substrate;
- forming a nickel film by a plating method at least on a surface of the conductive pattern; and
- forming nickel oxide as a metal oxide layer at least on the surface of the conductive pattern by providing the nickel film with an oxidizing heat treatment at a temperature between 850° C. and the melting point of the electrode material forming the conductive pattern.

This method allows using uniform and solid nickel oxide, which works as dense insulating film, as the metal oxide layer, so that reliable electronic components are obtainable although their fine conductive patterns have a high aspect ratio.

Exemplary embodiments of the present invention are demonstrated hereinafter with reference to the accompanying drawings. The drawings are schematic ones and do not show exact positional relations dimensionally. Similar elements to those in the drawings have the same reference marks and the detailed descriptions thereof are omitted.

FIRST EXEMPLARY EMBODIMENT

The first embodiment is demonstrated with reference to FIG. 1-FIG. 6. In FIG. 1, substrate 1 made of ceramic excellent in heat conductivity such as aluminum oxide has conductive patterns 2 on its both sides. Patterns 2 are made of electrode material such as Ag, and formed in a dual and helical coil-pattern. On the surface of each one of conductive patterns 2, metal film 5 (detailed later) made of Ni or the like is formed by a plating method, then metal film 5 undergoes a heat treatment or a chemical treatment to be oxidized, so that metal oxide layer 3 is formed. Through-holes 4 are provided when necessary for coupling conductive patterns 2 on both the sides electrically to each other.

Use of electroplating from among various plating methods for forming metal film 5 allows forming film 5 on the surface alone of conductive pattern 2 without using resist-mask. When metal film 5 is formed by this electroplating method, substrate 1 is dipped into electroplating solution for Ni (Watt solution) to undergo electrolysis, so that film 5 of Ni can be formed on the surface alone of conductive pattern 2.

Recent trend shows that conductive pattern 2 to be used for forming a coil has a higher aspect ratio. The reason is this: in order to increase an inductance and a Q value of coils, a narrower electrode width and a narrower interval between electrodes, and a higher electrode are necessarily required.

In the case of using conductive pattern 2 discussed above, it is difficult for conventional techniques to cover the edge sections or the wall (the face vertical with respect to the surface of substrate 1) of pattern 2 with a protective uniform film. However, the structure demonstrated in this embodiment allows metal oxide layer 3 to cover the entire surface of conductive pattern 2, made of electrode material such as Ag, solidly and uniformly. In other words, the structure can advantageously prevent migration of Ag or insulation defectives even a conductive pattern has a high aspect ratio. Since metal film 5 of Ni or the like is formed by a plating method on the surface of pattern 2, metal oxide layer 3 can be formed uniformly on any shape of pattern 2. At the same time, the edge sections of pattern 2 can be covered by layer 3 in the same thickness as that of the flat section.

As discussed above, metal film 5 formed uniformly by a plating method undergoes a heat treatment or a chemical treatment to be oxidized, so that metal oxide layer 3 is formed. A uniform and solid insulating protective film can be thus formed on the surface of a conductive resistor. As a result, compact, accurate and reliable electronic components are obtainable although they have fine conductive patterns 2 with a high aspect ratio. Conductive patterns 2 are made mainly of Ag having small conductive resistance.

Since those electronic components use a ceramic substrate as substrate 1 such as an aluminum oxide substrate good at heat conduction, the components are useful to power-supply modules that need good heat dissipation. Substrate 1 made of glass ceramic allows achieving a multi-layer wiring structure having built-in wiring material of Ag at an inner layer. This structure is useful to compact modules to be used at high frequencies and in portable devices that need a downsized body.

Use of electrode material containing Ag among others in conductive pattern 2 allows electronic components of the present invention to exhibit their advantage to the full extent. Use of Ag, Ag—Pt, or Ag—Pd in conductive pattern 2 allows the electronic components of the present invention to have a lower conductive resistance value and to be more reliable. In other words, it is crucial to select a metal that does not produce non-conductive film on its surface even the heat treatment is carried out in the atmosphere.

Metal oxide layer 3 that achieves the high reliability can be made from any material as far as metal film 5 becomes metal oxide layer 3 by heat treatment in the atmosphere. It is preferable to use at least one of NiO, ZnO, and CuO. The reason is this: The electroless plating method can be used for forming metal film 5 made of Ni, or Cu, and the electroplating method can be used for forming metal film made of Ni, Zn or Cu. Metal oxide layer 3 can be a single layer or multi-layer of film 5.

Metal oxide layer 3 preferably has a thickness ranging from 0.5-5 μm. A thickness less than 0.5 μm fails to obtain sufficient reliability, and a thickness greater than 5 µm fails to make fine intervals between electrodes of conductive patterns 2.

In this embodiment, conductive patterns 2 are formed on both the sides of substrate 1; however, pattern 2 can be formed on a single side thereof with the same advantage.

Figure 3:
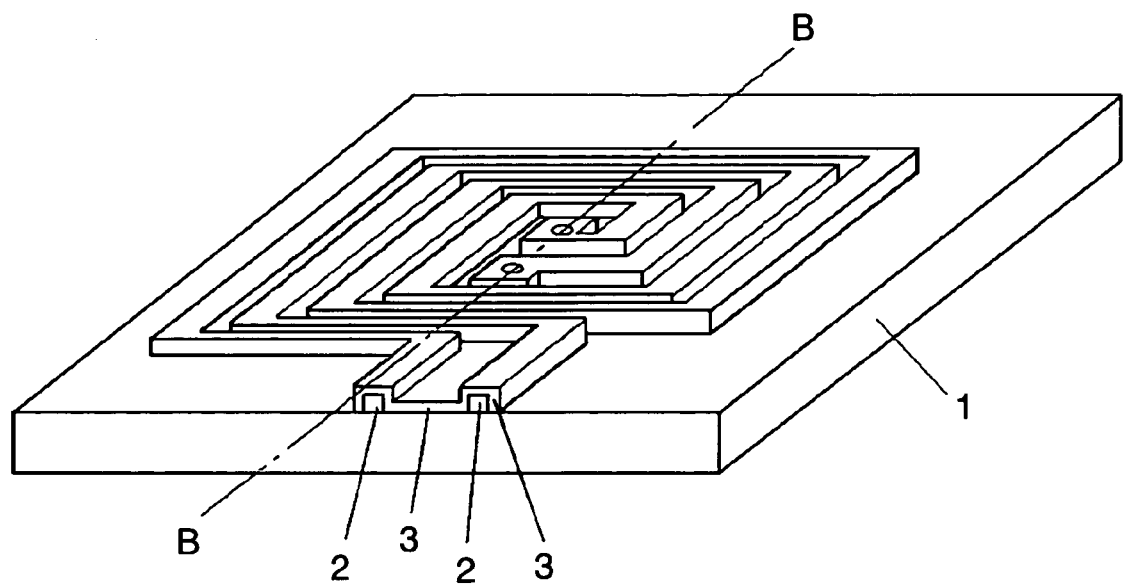
FIG. 3 shows a perspective view of a common-mode choke coil as another example in accordance with the first embodiment of the present invention.
Figure 4:
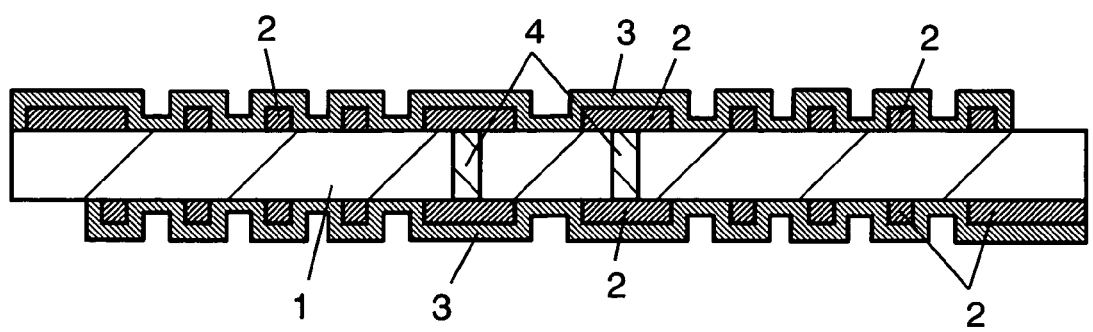
FIG. 4 shows a sectional view of the common-mode choke coil shown in FIG. 3 taken along line B-B'.

Next, another coil component is demonstrated with reference to FIGS. 3 and 4. In FIGS. 3 and 4, a glass ceramic substrate made of mixture of aluminum oxide powder and glass powder is used as substrate 1. This coil differs from that shown in FIGS. 1 and 2 in structure, i.e. metal oxide layer 3 is formed not only on the surface of conductive pattern 2 but also on the spaces between electrodes of pattern 2 on the substrate. This structure allows an electronic component to form conductive pattern 2 having narrower intervals between electrodes with reliability. Since this electronic component uses a glass ceramic substrate, made by baking at a low temperature, excellent in dielectric characteristics and productivity, multi-layers can be formed in the component with ease. This component is useful for compact module components to be used at high frequencies.

Figure 5:
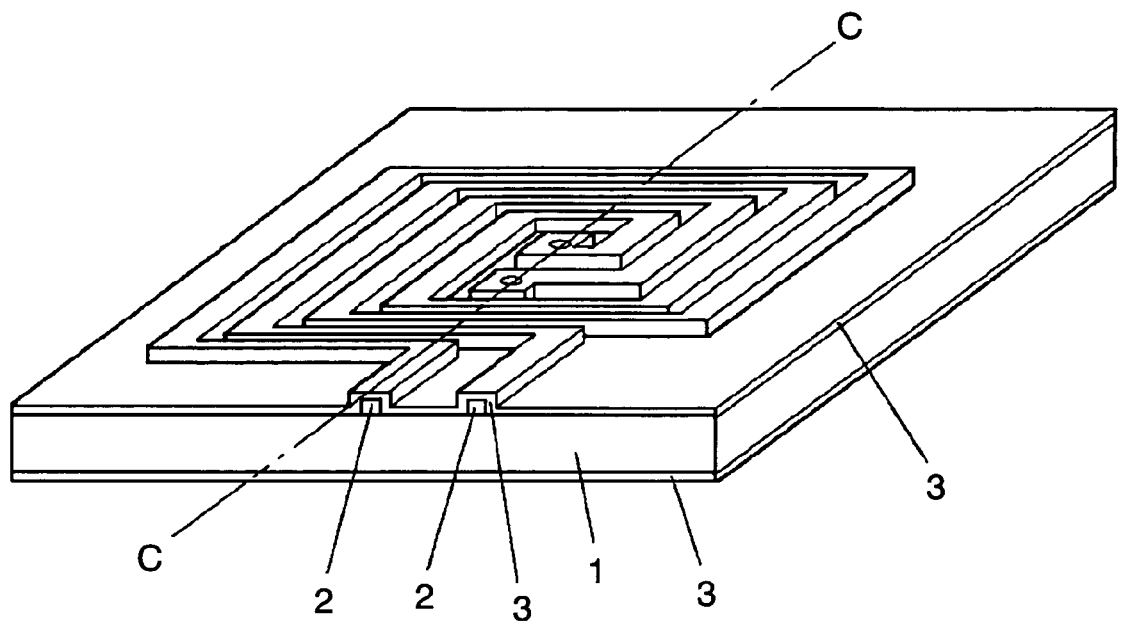
FIG. 5 shows a perspective view of a common-mode choke coil as still another example in accordance with the first embodiment of the present invention.
Figure 6:
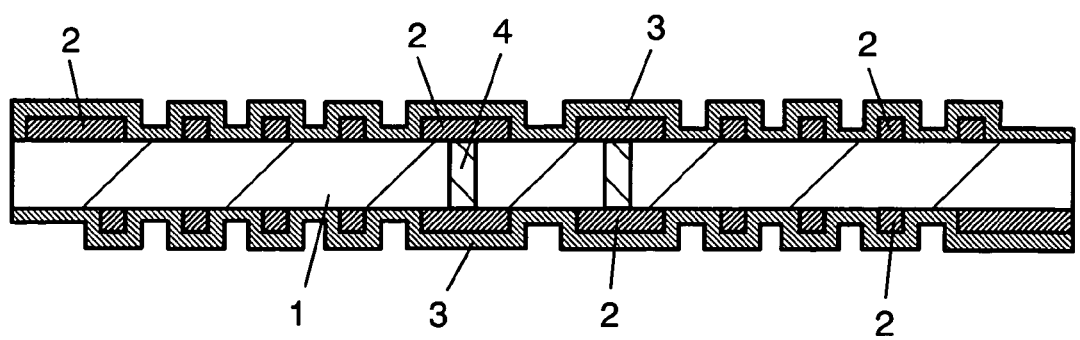
FIG. 6 shows a sectional view of the common-mode choke coil shown in FIG. 5 taken along line C-C'.

Still another coil component is demonstrated with reference to FIGS. 5 and 6. As shown in FIGS. 5 and 6, this coil differs from that shown in FIGS. 1 and 2 in a structure, i.e. metal oxide layer 3 is formed on the entire surface, where conductive pattern 2 is formed, of substrate 1. This structure allows metal oxide layer 3 to cover and protect conductive patterns 2 made of Ag or the like and formed not only at a given place with fine intervals between electrodes but also the other patterns 2 on the entire substrate 1. The component is useful for electrical equipment of car-use requiring environment-friendly components. For instance, a compound component formed of L and C, where no fine conductive pattern 2 is needed, can employ another electrode material having a high conductive resistance. Even in such a case, i.e. electrode materials different from what is discussed previously are used, providing metal oxide layer 3 on the entire surface of substrate 1 allows achieving reliable electronic component including compound components.

Figure 7A:
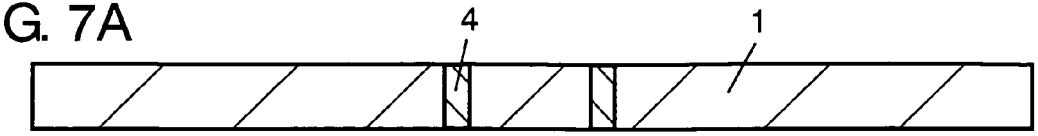
FIG. 7A shows a sectional view illustrating a step of manufacturing the electronic component in accordance with the first exemplary embodiment of the present invention.

A method of manufacturing the electronic component of the present invention is demonstrated hereinafter with reference to FIG. 7A-FIG. 7F. First, as shown in FIG. 7A, prepare substrate 1 made of aluminum oxide at a purity of 96% as an example of ceramic substrate. A glass-ceramic substrate made by low temperature firing and excellent in productivity can be used instead of the aluminum-oxide substrate. Provide through-holes 4 to substrate 1.

Figure 7B:
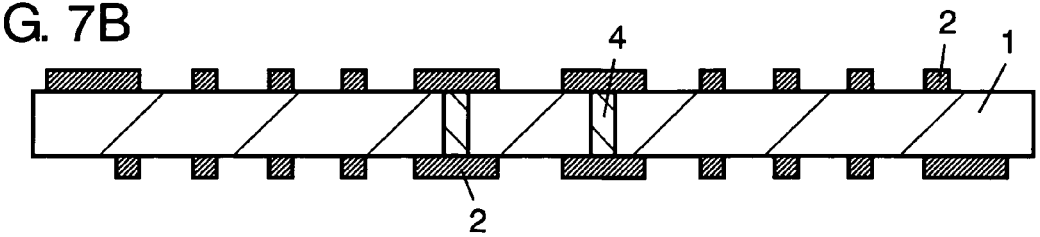
FIG. 7B shows a sectional view illustrating a step of manufacturing the electronic component in accordance with the first exemplary embodiment of the present invention.

Next, as shown in FIG. 7B, form conductive pattern 2 on the surface of substrate 1. Pattern 2 is formed by printing Ag paste by an intaglio printing method, then pattern 2 is baked at 900° C. Pattern 2 can be formed by the thin-film method or the plating method instead of the method discussed above.

Figure 7C:
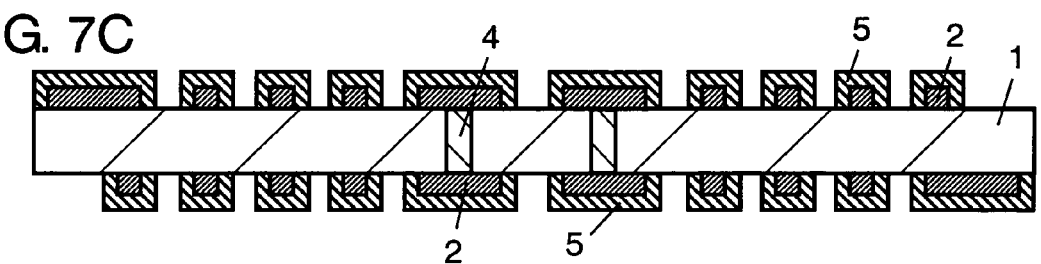
FIG. 7C shows a sectional view illustrating a step of manufacturing the electronic component in accordance with the first exemplary embodiment of the present invention.

Then as shown in FIG. 7C, form Ni-film in 2 µm thickness as metal film 5 on the surfaces of conductive pattern 2 and substrate 1 by the electroless plating method using plating solution of Ni—P or Ni—B. In this case, if metal film 5 in a given pattern is needed, use a resist material and a photolithograph method, thereby forming patterned metal film 5 with ease.

Figure 7D:
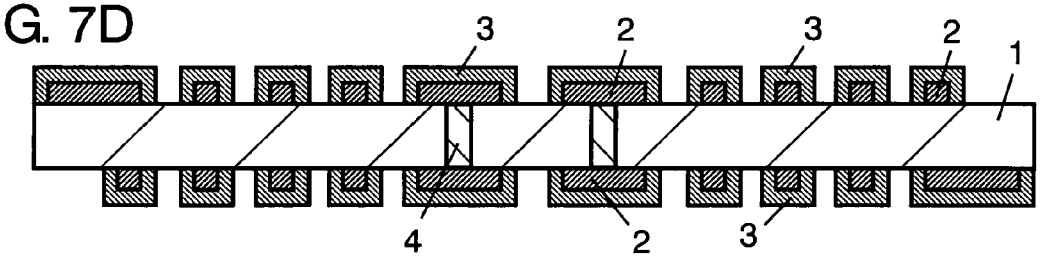
FIG. 7D shows a sectional view illustrating a step of manufacturing the electronic component in accordance with the first exemplary embodiment of the present invention.

Next, as shown in FIG. 7D, metal film 5 undergoes a heat treatment in the air under the following thermal oxidation conditions: rate of temperature rise: 200° C./hour, oxidizing temperature: 900° C., and holding time: 4 hours. Metal oxide layer 3 including NiO is thus formed. This oxidizing treatment makes the thickness of layer 3 approx. 3.2 µm.

In the foregoing thermal oxidation process, metal film 5 formed of Ni preferably undergoes the thermal oxidation at not lower than 850° C. and not higher than a melting point of the electrode material of conductive pattern 2. A temperature lower than 850° C. will need a longer time for the thermal oxidation, and a temperature higher than the melting point will deteriorate conductive pattern 2 or makes it difficult to maintain the pattern shape.

Figure 7E:
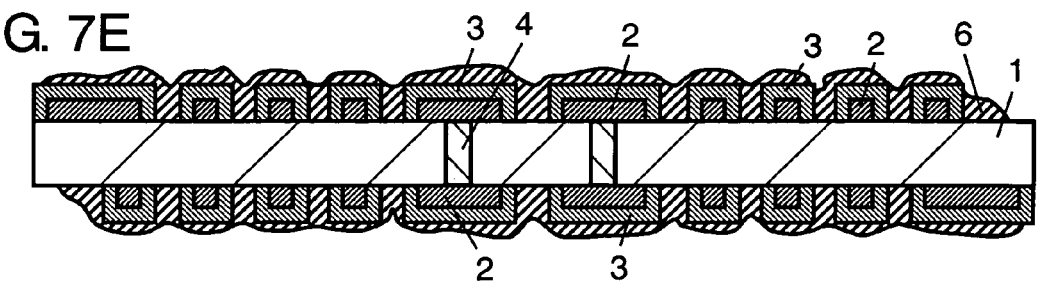
FIG. 7E shows a sectional view illustrating a step of manufacturing the electronic component in accordance with the first exemplary embodiment of the present invention.
Figure 7F:
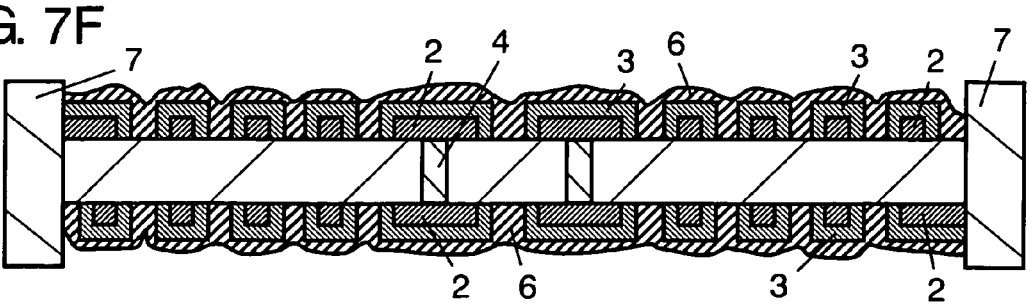
FIG. 7F shows a sectional view illustrating a step of manufacturing the electronic component in accordance with the first exemplary embodiment of the present invention.

Then as shown in FIG. 7E, provide protective film 6 made of insulating material such as glass on the surface of metal oxide layer 3 in order to further increase the reliability. Finally as shown in FIG. 7F, form end-face electrodes 7 to complete a chip-like electronic component. End-face electrode 7 can be made of any conductive material and preferably formed of plural layers instead of a single layer.

It is necessary to consider the mounting strength, solder wetability and solder leaching of end-face electrode 7 when it is surface-mounted on a printed circuit board. To be more specific, preferably use the same material as conductive pattern 2 at the lowest layer, a nickel electrode at the medium layer for preventing solder leaching, and a solder electrode or a tin electrode excellent in solder wetability at the outermost layer. However, this is just an example, and it is not necessarily to use this structure. Conductive resin material or alloy of Ag—Pt or Ag—Pd can be used instead of well-conductive metals.

As shown in FIG. 7D, metal oxide layer 3 formed by oxidizing metal film 5 is not necessarily to cover the entire surface of substrate 1, namely, coverage on the surface of conductive pattern alone allows layer 3 to work as an insulating film to protect Ag that forms pattern 2. As shown in FIG. 6, coverage by layer 3 on the surface of pattern 2 and the spaces between electrodes on substrate 1 allows layer 3 to work as an insulating protective film with higher reliability at the following places: where closer pattern 2 is needed or between electrodes where a higher voltage is applied.

SECOND EXEMPLARY EMBODIMENT

Figure 8:
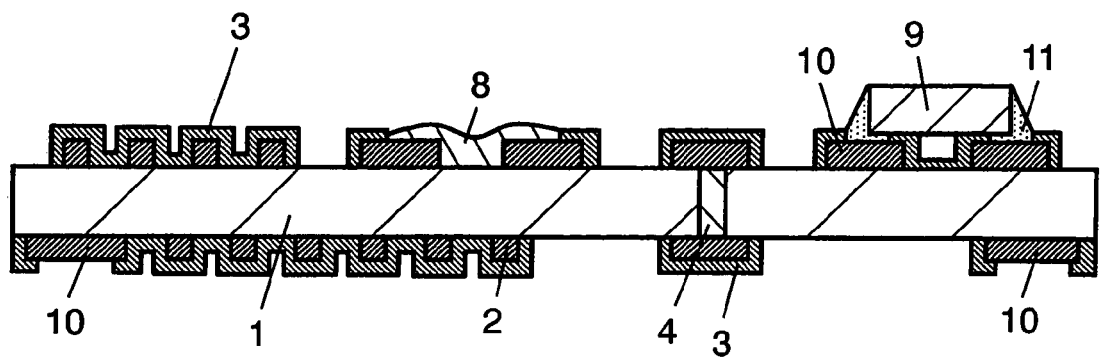
FIG. 8 shows a sectional view illustrating an electronic component in accordance with a second exemplary embodiment of the present invention.
Figure 9:
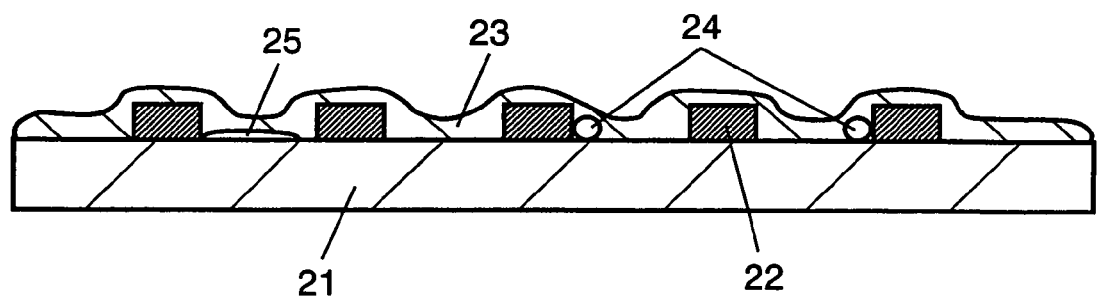
FIG. 9 shows a sectional view of a conventional electronic component.

The second embodiment is demonstrated hereinafter with reference to FIG. 8. Similar elements to those in the first embodiment have the same reference marks, and the descriptions thereof are omitted. The construction shown in FIG. 8 differs from that described in the first embodiment in the material of substrate 1, namely, substrate 1 here is formed of organic substrate made from, e.g. glass epoxy. Use of the organic substrate allows enlarging the area of substrate 1, thereby increasing the productivity.

In the case of using an organic substrate as substrate 1, conductive pattern 2 of which surface layer includes Ag has been formed in advance by the photolithography method on the organic substrate, and Ni-plated layer having 1 µm thickness is formed on that surface layer by the electroless plating method, so that a metal film is obtained.

Next, the metal film undergoes an oxidation treatment. Use of an organic substrate is regulated by an upper limit of a heating temperature, so that the oxidation treatment is preferably carried out in the following way: Prepare acid solution of not higher than pH3, and dip substrate 1 into the solution, or place substrate 1 together with the solution in an airtight space for oxidizing substrate 1. Such a chemical treatment oxidizes Ni to NiO. Metal oxide layer 3 thus obtained is thin and has a uniform distribution of film thickness, so that it can be formed uniformly at minute sections of conductive pattern 2.

Here is another difference from the structure described in the first embodiment: Terminal electrode sections 10 are provided on the surface of substrate 1, and these terminal electrode sections 10 are parts of conductive pattern 2 and that parts are not covered by metal oxide layer 3, so that terminal electrode sections 10 are exposed. Presence of such terminal electrode sections 10 allows soldering terminal electrodes 11 of component 9 to electrode sections 10 with ease. Component 9 shown in FIG. 8 includes a semiconductor device, coil, capacitor, or resistor having terminal electrodes 11. This structure is useful for building module components working at high frequencies.

At this time metal oxide layer 3 works as a pattern mask for mounting the component by soldering, so that each one of terminal electrode sections 10 can be used with ease as a mounting land. As a result, no resist is needed.

In the case of a module component that uses an example of substrate 1 partially exposing its surface, electrical resistance pattern 8 can be formed on substrate 1 by using a thick-film or a thin-film technique. If metal oxide layer 3 exists beneath resistance pattern 8, layer 3 and the resistance material of pattern 8 react chemically or thermally with each other, which can adversely affect a resistance value, a temperature coefficient or resistance noises. In the case of using carbon resistor as resistance pattern 8, a surface roughness or a material of the substrate sometimes affects the resistance characteristics. However, the structure according to the present invention allows obtaining electronic components in which stable elements can be placed on substrate 1.

The electronic components of the present invention use a metal oxide layer as an insulating protective film, which is formed uniformly by a plating method on an insulating layer, so that a uniform and solid insulating film is obtainable with ease even the conductive pattern is minutely formed and has a high aspect ratio. Use of electrode material containing Ag in the conductive pattern advantageously allows obtaining the compact, accurate and reliable electronic components that have few migrations.

INDUSTRIAL APPLICABILITY

The electronic components of the present invention, in which a uniform and solid insulating protective film can be formed efficiently, can be widely used as reliable and compact electronic components in portable electronic devices.

The invention claimed is:

1. An electronic component comprising:
   a conductive pattern comprising at least two electrodes provided on an insulating substrate;
   a metal film formed by a plating method on a surface of the conductive pattern; and
   a metal oxide layer formed by oxidizing the metal film and disposed on the surface of the conductive pattern,
   wherein the metal oxide layer is formed on a portion of the substrate between electrodes of the conductive pattern on the substrate,
   the conductive pattern uses an electrode material including at least Ag,
   the metal oxide layer includes one material selected from the group consisting of NiO, ZnO, and CuO, and
   the metal oxide layer has a thickness ranging from 0.5 μm to 5 μm.

2. The electronic component as defined in claim 1, wherein the metal film is formed by a plating method on a surface of the substrate, where the conductive pattern is provided.

3. The electronic component as defined in claim 1, wherein the substrate uses a ceramic substrate.

4. The electronic component as defined in claim 1, wherein the substrate uses a glass-ceramic substrate.

5. The electronic component as defined in claim 1, wherein the substrate uses an organic substrate.

6. The electronic component of claim 1, wherein the electrode material includes one material selected from the group consisting of Ag, Ag—Pt, and Ag—Pd.

7. The electronic component as defined in claim 1, wherein a part of the conductive pattern is exposed at the surface of the component.

8. The electronic component as defined in claim 2, wherein a part of the conductive pattern and a part of the substrate are exposed at the surface of the component.

9. A method of manufacturing an electronic component, the method comprising the steps of:
   forming a conductive pattern on a surface of an insulating substrate;
   forming a metal film by a plating method on a surface of the conductive pattern and on a portion of the surface of the insulating substrate; and
   forming a metal oxide layer by oxidizing the metal film on the surface of the conductive pattern and on the portion of the surface of the insulating substrate,
   wherein the conductive pattern uses electrode material including at least Ag,
   the metal oxide layer includes one material selected from the group consisting of NiO, ZnO, and CuO, and
   the metal oxide layer has a thickness ranging from 0.5 μm to 5 μm.

10. The method as defined in one of claim 9, wherein the plating method uses an electroless plating method.

11. The method as defined in claim 9 wherein the oxidizing is done by a heat treatment.

12. The method as defined in claim 11, wherein the heat treatment is carried out at a temperature not higher than a melting point of the conductive pattern.

13. The method of manufacturing an electronic component according to claim 9, wherein the metal film is a nickel film, and
   said step of forming the metal oxide layer comprises forming a nickel oxide layer as the metal oxide layer at least on the surface of the conductive pattern by providing the nickel film with an oxidation heat treatment at a temperature between 850° C. and a melting point of electrode material forming the conductive pattern.

* * * * *